United States Patent

Wang et al.

[11] Patent Number: 5,817,545
[45] Date of Patent: Oct. 6, 1998

[54] PRESSURIZED UNDERFILL ENCAPSULATION OF INTEGRATED CIRCUITS

[75] Inventors: Kuo K. Wang; Sejin Han, both of Ithaca, N.Y.

[73] Assignee: Cornell Research Foundation, Inc., Ithaca, N.Y.

[21] Appl. No.: 590,585

[22] Filed: Jan. 24, 1996

[51] Int. Cl.$^6$ .................................................. H01L 21/56
[52] U.S. Cl. .......................................... 438/127; 438/126
[58] Field of Search ..................................... 437/211, 212; 257/787; 264/272.17; 425/546, 117, 129.1; 174/52.2; 29/855, 856; 438/127, 126

[56] References Cited

U.S. PATENT DOCUMENTS

| | | | |
|---|---|---|---|
| 5,082,615 | 1/1992 | Sakai | 264/571 |
| 5,203,076 | 4/1993 | Banerji et al. | 29/840 |
| 5,218,234 | 6/1993 | Thompson et al. | 257/787 |
| 5,244,838 | 9/1993 | Casati et al. | 437/212 |
| 5,275,546 | 1/1994 | Fierkens | 425/117 |
| 5,381,599 | 1/1995 | Hall | 29/856 |
| 5,385,869 | 1/1995 | Liu et al. | 437/211 |
| 5,450,283 | 9/1995 | Lin et al. | 174/52.2 |
| 5,512,232 | 4/1996 | Addeo et al. | 425/129.1 |
| 5,570,272 | 10/1996 | Variot | 29/855 |
| 5,589,714 | 12/1996 | Howard | 257/788 |
| 5,609,889 | 3/1997 | Weber | 425/117 |

OTHER PUBLICATIONS

Dion, J. et al, 1994, Material and Reliability Condsiderations for Anisotropically Conductive Adhesive Based Interconnections, Mat. Res. Soc. Symp., Proc. 323, Pittsburgh, PA. No month.

Giesler, J., et al, 1994, Flip Chip on Board Connection Technology: Process Characterization and Reliability, IEEE CPMT, pt. B, v. 17, 256–263. No month.

Machuga, S.C. et al, 1992, Encapsulation of Flip Chip Structures, IEEE/CHMT Symposium, p. 53, No month.

Miller, L.F., 1969, Controlled Collapse Reflow Chip Joining, IBM j of Res and Dev., V. 13, 239–250 No month.

Nakano, F., et al, 1987, Resin Insertion Effect On Thermal Cycle Resistivity of Flip–Chip Mounted LSI Devices, ISHM, Conf., 536–541 No month.

O'Malley, G. et al., 1994, The Importance of Material Selection for Flip Chip On Board Assemblies, IEEE CPMT, Pt. B. v. 17, 248 No month.

Suryanarayana, D. et al, 1991, Enhancement of Flip Chip Fatigue Life by Encapsulation, IEEE CHMP, 14, 218–223 No month.

Suryanarayana, D. et al, 1993, Encapsulants used in Flip- –Chip Package, 43 rd ECTC, Orlando, FL.

Tummala, R. et al, 1989, Microelectronics Packaging Handbook, Van Nostrand Reinhold, NY No month.

*Primary Examiner*—John Niebling
*Assistant Examiner*—Kevin F. Turner
*Attorney, Agent, or Firm*—Brown, Pinnisi & Michaels, PC

[57] ABSTRACT

A new method and device to encapsulate integrated circuits such as flip chips and BGA packages. A special mold to surrounds the chip to be encapsulated in a cavity, and the encapsulant is injected into the cavity at an elevated pressure, and possibly at an elevated temperature. This shortens the cavity filling time by two or three orders of magnitude, compared to the conventional dispensing process. The reliability of the package is increased by increasing the adhesion of encapsulant to the package, by controlling fillet shape through in-mold curing, and by completely filling the cavity through proper mold design and, optionally, evacuation of the cavity prior to injection. The invention also allows the use of a wider range of encapsulants, including highly viscous material, fast curing materials and reworkable materials.

6 Claims, 4 Drawing Sheets

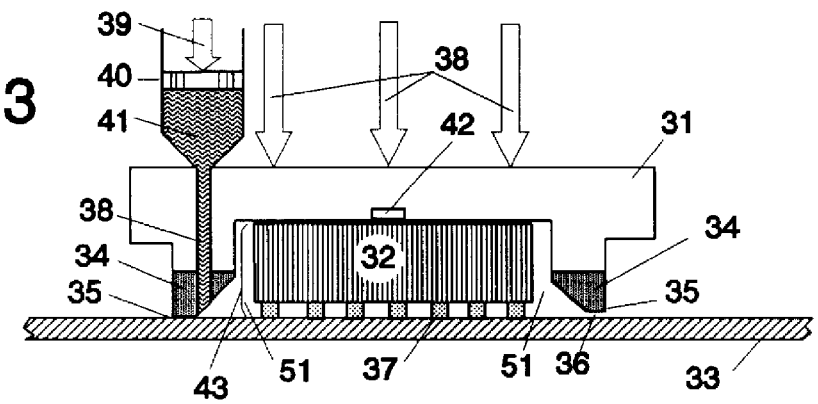
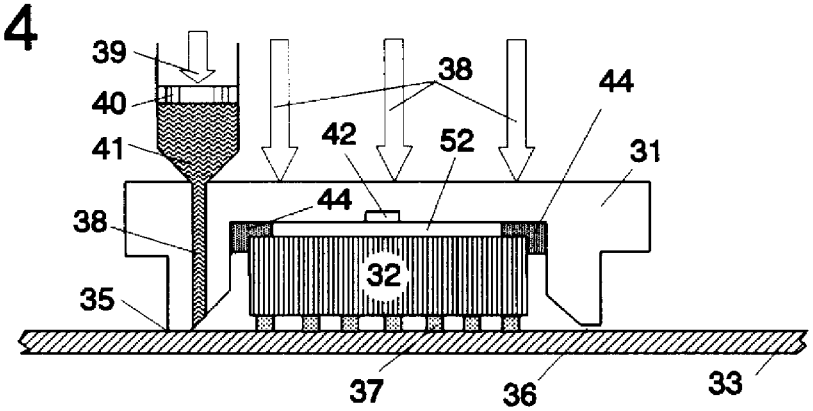
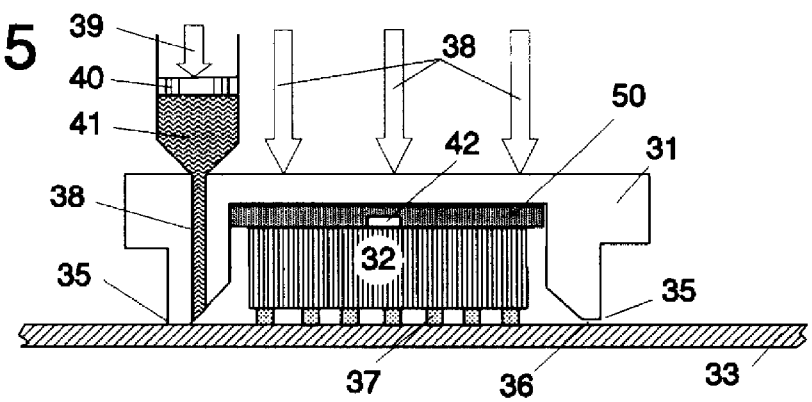
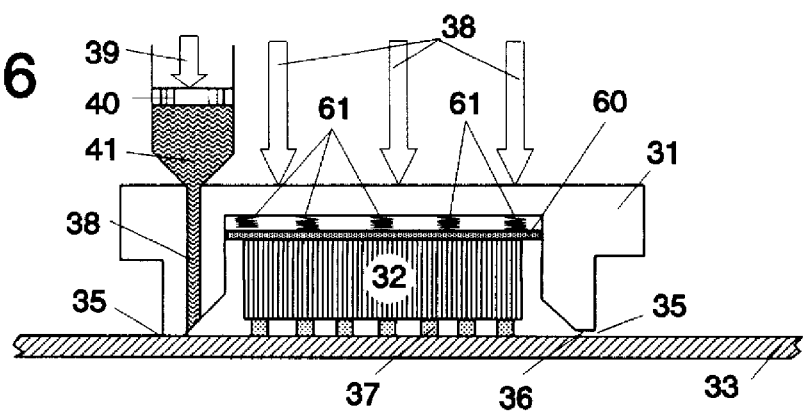

PRESSURIZED UNDERFILL ENCAPSULATION OF INTEGRATED CIRCUITS

FIELD OF THE INVENTION

The invention pertains to the field of manufacture of integrated circuitry. More particularly, the invention pertains to an improvement in encapsulation for the "flip chip" type of integrated circuit.

BACKGROUND OF THE INVENTION

A "flip chip" is a semiconductor die having terminations all on one side in the form of solder pads or bump contacts. After the chip has been passivated or otherwise treated, it is flipped over for attaching to a matching substrate. A "BGA" or "Ball Grid Array" chip is similar to the "flip chip", except that the chip is mounted on a carrier, with wires connecting the chip to the carrier, and the carrier has the solder pads for connection to the substrate.

The use of flip chips and BGA chips have inherent advantage over other methods in high-density electronic packaging because it provides an area array (2 dimensional) that interconnects the chip and the substrate Tummala and Rymaszewski, 1989). However, due to the high production cost of today's technology, its market share among semiconductor chip industry is low as yet. As the flip-chip and BGA technology improves, their uses are expected to increase drastically in the near future. The Semiconductor Industry Association projects a 250-fold increase in IC functional density over the next 15 years. Flip-chip technology and BGA technology is expected to play a major role in accomplishing such a goal due to its capability of connecting high numbers of i/o and compactness. However, the predicted growth rate by experts all depends on the ability to reduce production cost significantly.

Traditionally, flip-chip technology uses ceramic material as chip carrier or substrate (see Miller, L. F., 1969, *"Controlled Collapse Reflow Chip Joining"*, IBM J of Res. and Dev., v. 1 3, 239–250.). Because of the similarity of the thermal-expansion coefficients of the chip and ceramic, thermal stresses during thermal excursions were not a serious problem.

Recently, the desire for low cost mass production has resulted in the growing use of organic materials for substrates (Flip chip on board or "FCOB"). The current process typically uses solder to connect the chip to the board. Although efforts are being made to use electrically conductive polymers to connect the chip to the board (see Dion, J., Borgesen, P., Yost, B., Lilienfeld, D. A. and Li, C. Y., 1994, *"Material and Reliability Considerations for Anisotropically Conductive Adhesive Based Interconnects"*, Mat. Res. Soc. Symp., Proc. 323, Pittsburgh, Pa.), such development is still in the research stage.

In FCOB, the difference in thermal-expansion coefficient between the chip (2.5 ppm/°C.) and the organic substrate (15 ppm/°C.) causes significant shear strain on the interconnects during temperature cycling, ultimately resulting in fatigue cracking and electrical failure (Machuga, S. C., Lindsey, S. E., Moore, K. D. and Skipor, A. F., 1992, *"Encapsulation of Flip Chip Structures"*, IEEE/CHMT Symposium, p.53.). This is particularly true as the size of the chip increases because the thermal stress in the interconnect increases with DNP (distance from the neutral point).

This problem can be significantly reduced by encapsulating the space between the solder joints with encapsulant to provide mechanical reinforcement. Because the encapsulation is provided mainly under the chips, this process is called "underfill encapsulation". Underfill encapsulation is different from encapsulation of other packages such as DIP or PGA, which require encapsulation on all sides of the chip.

Underfill encapsulation has resulted in more than a tenfold increase in the reliability of the flip chip on board technology (Nakano, F., Soga, T., Amagi, S., 1987, *"Resin Insertion Effect on Thermal Cycle Resistivity of Flip-Chip Mounted LSI Devices"*, ISHM Conf., 536–541; Suryanarayana, D., Hsiao, R., Gall, T. P., McCreary, J. M., 1991, *"Enhancement of Flip Chip Fatigue Life by Encapsulation"*, IEEE CHMP, v.14, 218–223). The same is true for BGA technology.

Currently, most flip chip and BGA packages are encapsulated by dispensing the encapsulant along the periphery of one or two sides of the chip. Capillary action (i.e. a surface-tension phenomenon) drives the encapsulant through the space between the chip and the board. After the filling is complete, the board is taken to an oven where it is cured. The current encapsulation process has the following problems:

(1) Filling and curing: Because the current process fills the cavity (space between the chip and the board) by capillary action, it is very slow and could be incomplete, resulting in voids. The filling problem becomes even more serious as the chip size increases. The fill time is proportional to the square of the length of the chip. (See Suryanarayana, D., Wu, T. Y., Varcoe, J. A., 1993, *"Encapsulants Used in Flip-Chip Package"*, 43rd ECTC, Orlando, Fla.) For example, in a typical encapsulation operation, the filling takes about 2 minutes for a small chip (¼") to 15 min. for a large chip (¾"). Because the filling is slow, the encapsulant has to be a slowly curing material. Thus, curing of the encapsulant typically requires several hours in an oven. The slow filling and curing process is detrimental to mass production.

(2) Adhesion: Adhesion of the fluid to the chip is essential for achieving good reliability of the encapsulated chip. High wettability of the fluid requires low surface tension which, in turn, leads to an even slower cavity filling.

(3) Encapsulant: Development of materials suitable for flip chip encapsulation is difficult. The encapsulant needs to have good fluidity, wettability, matching thermal expansion coefficient with the solder and with appropriate curing kinetics. It is difficult to satisfy all these at the same time. Currently, most encapsulants are epoxy-based thermoset which are filled with solid fillers (O'Malley, G., Giesler, J. and Machuga, 1994, *"The Importance of Material Selection for Flip Chip on Board Assemblies"*, IEEE CPMT, Pt. B, v.1 7, 248.). On one hand, It is desirable to increase the filler content to match the thermal-expansion coefficient of the solder but on the other hand, the viscosity increases sharply with the filler content, which make the flow more difficult. Another problem with the current encapsulant is because of its thermosetting nature, the repair of the board is difficult.

Some recent inventions have tried to improve the flip-chip encapsulation process.

U.S. Pat. No. 5,218,234 granted to Thompson, K. R., Banerji, K. and Alves, F. D., in 1993 for a "Semiconductor Device with Controlled Spread Polymeric Underfill", teaches creating a window-frame shaped opening in the film on the substrate. The semiconductor device lies in the interior perimeter of the opening. The window frame opening in the film serves to confine the encapsulant which fills the space between semiconductor device and substrate to within the opening. This prevents unwanted spread of the encapsulant and help form an ideal fillet geometry. Other than this, this invention still suffers from the disadvantages that the dispensing process have.

U.S. Pat. No. 5,203,076, granted to Banerji, K., Alves, F. D., and Darveaux, R. F., in 1993 "Vacuum Infiltration of Underfill Material for Flip-Chip Devices", applies and removes vacuum to encapsulate the chips. In this process, a bead of underfill material is provided on the substrate about the periphery of integrated circuit. Vacuum is then applied to evacuate the area between integrated circuits and the substrate through the underfill encapsulant. After that, the vacuum is removed forcing the underfill material into the evacuated area. This process, however, involves three steps and requires a vacuuming process which is not effective for highly viscous encapsulant. The key differences between Banerji's patent and our invention can be summarized as follows:

1. Banerji's method depends first on a partial vacuum to "suck out" the air from the under-chip area and let it "bubbling through the polymer infiltration" (line 54, p. 2)—a method inherently impossible to get all the air out. This is even after the air is let in (at the atmospheric pressure) again to push the polymer to infiltrate the partially-vacuumed under-chip area. The air in the chamber always maintains a uniform pressure (i.e. no gradient) except at the instant when the vacuum is applied or removed. On the contrary, our invention pushes the air out of the under-chip area by the flow front of the liquid polymer coming in at one point (gate) driven by a pressure gradient from the injection system. The flow front advancement can be predicted by computer simulation to ensure that all the air is evacuated (not bubbling through).

2. Because of high pressure gradient (which can be as high as 1000 psi), the filling time in the present invention is less than one second, not "about 50 seconds" in Banerji's patent, or 5 to 20 minutes in conventional underfill method.

3. The fillet geometry is considered critical to the reliability of the package. In Banerji's invention, the shape of the fillet is determined by the force balance of the surface tension and gravity on the encapsulant. This limits controllability of the shape of the fillet, because neither factor can be controlled. In contrast, in the present invention, the fillet shape can be controlled by the proper design of the mold. Especially when in-mold curing is used, the fillet shape will exactly follow that of the mold cavity.

4. Also, because of the fast filling time with the current invention, fast-curing encapsulant can be used to reduce the cycle time. U.S. Pat. No. 5,381,599, granted to Hall, G. L., in January 1995, for "Liquid Crystal Polymer Encapsulated Electronic Devices and Methods of Making the Same", uses a high pressure and high temperature process to encapsulate flip-chips with a rigid liquid crystal polymer. The encapsulation is applied over the flip-chips. Epoxy polymer can be applied over and part of under the chip before applying liquid crystal polymer. This process cannot fill the cavity underneath the chip completely, which will be detrimental to the reliability of the package. Also, the encapsulant used is liquid crystal polymer which is as yet less popular than epoxy.

SUMMARY OF THE INVENTION

A new method and device to encapsulate integrated circuits such as flip chips and BGA package has been developed. This process involves a special mold to surround the chip to be encapsulated and injection of the encapsulation material at elevated pressure.

Flip Chip on Board (FCOB) technology and Ball Grid Array (BGA) technology generally requires encapsulation of the solder joints to reduce the loads on such joints during thermal excursions. At present, the encapsulation process constitutes the primary obstacle to widespread acceptance and implementation of FCOB or BGA technology because of the long process times involved, and because of the subsequent lack of reparability. The process developed here addresses both of these issues.

The present invention has the following advantages:

(1) The filling time can be reduced dramatically compared to dispensing encapsulation process. For example, for a 0.3" chip, the fill time can be as much as 100 times or more smaller. For the test case described below, the filling time was reduced by 100 times. The curing process can also be shortened by using a faster-curing encapsulant, which is impractical in the current process.

(2) The filling process can be done at room temperature if in-mold curing is not needed, as compared to the prior-art dispensing process which typically requires heating. Alternatively, in-mold curing can be used to get the best quality of encapsulation, which will require mold heating.

(3) Another benefit that can be achieved from this process is a potential increase in reliability of the package. First, as indicated in Giesler et al. (Giesler, J., O'Malley, G., Williams, M. and Machuga, S., 1994, "*Flip Chip on Board Connection Technology: Process Characterization and Reliability*", IEEE CPMT, pt. B, v. 1 7, 256–263.), reliability of the package increases as the encapsulation temperature decreases. Because in the new process, encapsulation can be conducted at room temperature, the reliability of the package increases compared to other processes which are done at elevated temperature. Second, it is well known (see Giesler et al.) that the reliability of the package depends on the fillet shape. The current process can control the fillet shape better than the dispensing process by designing the mold appropriately. Third, for the in-mold curing process, the curing will take place under high pressure which will enhance the adhesion of encapsulant to the package. The enhanced adhesion will improve the reliability of the package.

(4) The selection or development of encapsulant will become much more flexible. For example, it is no longer necessary to compromise the wettability and the surface tension. Also, the process will be able to handle materials with higher viscosity thus allowing more fillers to be added to the encapsulant in order to better match the thermal-expansion coefficients of the encapsulant and the solder. It can also handle thermoset material with much faster curing kinetics. It will also be possible to add rubbery plastic to the encapsulant. This will soften the cured encapsulant when heated, making the reworkability of the package possible.

BRIEF DESCRIPTION OF THE DRAWING

FIG. 3 shows a side cut-away view of the mold of the invention in an embodiment having bumpers at the bottom edge of the mold body.

FIG. 4 shows a side cut-away view of another embodiment of the mold of the invention, having bumpers inside the corners of the mold cavity.

FIG. 5 shows a side cut-away view of another embodiment of the mold of the invention, using a resilient plate in the top of the mold cavity as a bumper.

FIG. 6 shows a side cut-away view of another embodiment of the mold of the invention, using a plate with springs in the top of the cavity as a bumper.

DESCRIPTION OF THE PREFERRED EMBODIMENT

The Molding Apparatus

The method and apparatus of the invention represents a novel advance in the technology of encapsulating integrated circuits such as the flip chip and BGA chip. The method and apparatus of the invention can improve processability and reliability of flip-chip or BGA packaging, and allows the use of a reparable encapsulant such as thermoplastic polymer.

Figure 1:
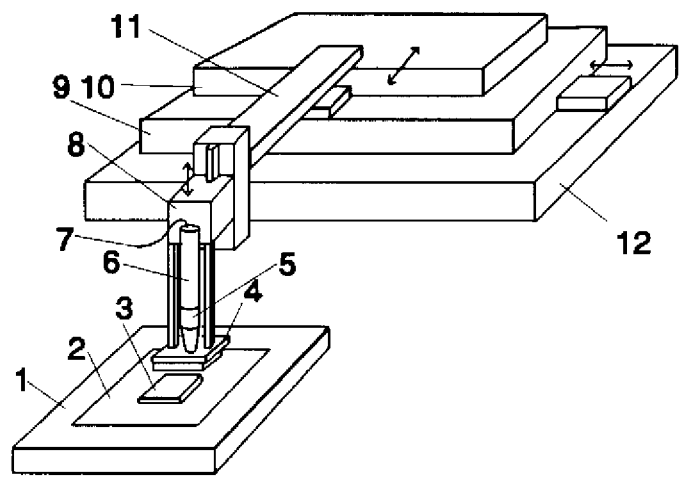
FIG. 1 shows a view of the apparatus of the invention.

The overall schematic of the encapsulation apparatus of the invention is shown in FIG. 1. This device consists of a translation system (9) and (10), clamping system (8), an encapsulant injection system (5), (6) and (7), and an enclosed mold-head (4) which will support the chip (3) and confine and seal the flow of encapsulant during encapsulation. A bracket (11) connects the translation system to the mold/clamping system.

The chip (3) has been soldered to its substrate (2), which is mounted on a platen (1) for the encapsulation process. The apparatus is mounted on a base plate (12) which is mounted rigidly relative to the chip holding platen (1), so that the planes of the chip (3), substrate (2), platen (1), mold (4), and the translation system plates (9) and (10) are parallel.

The translation system preferably has three independent parts for accurate motion of the mold in the X and Y horizontal directions, and possibly also in the Z vertical direction (in which case the vertical movement of the translation system can also function as the clamping system). It should be noted that these directions are intended to refer to motion relative to the chip. While it is possible that the apparatus might be mounted sideways from the orientation shown, encapsulating chips on a vertical substrate, the terms "X" and "Y" and "horizontal" will be used herein to mean "parallel to the plane of the chip", and "Z" or "vertical" to mean "orthogonal to the chip".

The translation system can be any two- or three-dimensional movement system known to the art, and is shown in a preferred embodiment of two flat tables (9), and (10), each movable in only one axis (X, and Y respectively). In order to allow the most accurate movement possible in each axis, the tables are moved by stepper motors, although worm-gear or rack-and-pinion or other systems are also possible within the teachings of the invention.

The exact control circuitry used by the apparatus to move the mold head through the translation system will depend upon the exact mechanism chosen to move the translation system, and in any case would be within the ability of one skilled in the art to design.

Preferably, the translation system is controlled through a vision system which can automatically locate the mold-head (4) over the chip (3). The vision system can be a commercial system designed for the purpose, such as is available from Universal Instrument Corporation, Binghamton, N.Y.

The mold (4) is pressed down against the substrate (2), surrounding the chip (3), through the force exerted by the clamping system (8), which moves the mold (4) in the vertical or "Z" direction. The clamping system exerts a precise force on the chip (3) to counteract the pressure of the pressurized encapsulation fluid being injected into the mold.

The clamping force can be applied through electrical motor system, using stepper motors such as are preferably used in the translation system or a rack-and-pinion or worm-gear system.

Alternatively, a fluid pressure system using air or hydraulic pressure against a piston could be used. When the clamping is done through an electrical system, a sensor to detect the clamping force will be required to maintain appropriate clamping force during encapsulation. On the other hand, when fluid pressure is used for clamping, the fluid pressure can be varied to get an appropriate clamping force.

In another alternate embodiment, the translation system can have a "Z" axis component to position and lower the mold over the chip and also to provide the clamping force.

The encapsulant is kept in a reservoir (5), which is preferably pressurizable by a piston mechanism (6) activated by a fluid pressure or electrical signal routed by appropriate cabling or tubing (7). Preferably, the piston is actuated by fluid pressure, for ease of regulation. Alternatively, a sealed reservoir could be used, which is pressurized by air pressure to force the encapsulant into the mold.

The injection system can be either position or pressure controlled. In pressure-controlled system, the fluid pressure (air or hydraulic) at the piston in the injection system, injecting the encapsulant at constant pressure. In this case, the completion of the mold filling will be when the injection velocity drops to near zero. On the other hand, in position-controlled system, the position of the piston is controlled to inject the encapsulant at a certain speed. In which case, the completion of mold filling will be when the injection pressure suddenly rises to a high value.

The mold-head (4) is specially configured to fit the chip geometry with its lower end in close contact with the board surface (2) to seal off the area.

Mold Head Design

The design of mold-head is shown in detail in FIGS. 3 through 13.

Referring to FIG. 3, the mold body (31) has a cavity (43) which is sized to surround the chip (32) closely on top, with a gap left around the periphery of the chip to create a side region (51) for the formation of a fillet.

The size of the gap forming the side region (51) has to be designed carefully. Typically, the thickness of the side region (51) will be much bigger than that of the cavity region between the chip (32) and the board (33). If the size of the side region is too big, the flow of encapsulant in the side during encapsulation may precede the flow under the chip because of the lower flow resistance in the side region. If the flow in the side region is much faster than that in the cavity region, the flow in the side region may block the flow in the cavity region resulting in voids in the cavity.

The chip (32) is mounted to the substrate (33) by solder connections (37). The lower sides of the mold body (35) are firmly held against the substrate (33) by the clamping force (38) to prevent the leakage of encapsulant outside the mold during encapsulation. The mold body presses down upon the chip (possibly through a bumper or plate as described below, or by directly contacting the upper surface of the chip) to firmly and accurately position the chip and to keep the chip from being lifted off the substrate or forced laterally by the force of injection of the encapsulant.

An inlet channel (45) connects the cavity (43) to the reservoir of encapsulant (41). A piston (40) allows an injection force (39) to force encapsulant through the inlet channel (45) into the cavity under pressure. At the opposite side of the mold from the inlet channel (45), an air vent (36) allows air to escape during encapsulant injection. The air vent is preferably very small (perhaps less than one mil), and is preferably machined as a small slot or indentation in the lower edge of the mold.

To seal the mold cavity, hold the chip without damage and to accommodate the variations in chip size and height, a resilient bumper is used to counteract the clamping force and support the mold against the substrate. Four different designs are shown in FIGS. 3 through 6 and described below. In all but the design of FIG. 6, the bumper is made of resilient material such as silicone rubber.

FIG. 3 shows a design in which the bumper (34) is formed by making the lower region of the mold-head (31) of resilient material. The mold body (31) directly contacts the top of the chip (32) in this embodiment.

In FIG. 4, the cavity (43) is made taller, leaving a gap (52) above the chip (32). Bumpers made of resilient material (44) are placed in the corners of the mold cavity (43). FIG. 5 is basically an extension of FIG. 4, in which the bumper is made of a plate (50) made of resilient material which fills the entire upper part of the mold cavity, fitting between the chip and the mold. The size of the bumper has to be designed carefully to ensure adequate sealing while not damaging the chips.

Referring to FIG. 6, a movable plate (60) has been used to seal the top area of the chip (32). A controlled clamping force can be applied to the plate using springs (61) between the mold body (31) and the plate (60).

Figure 8:
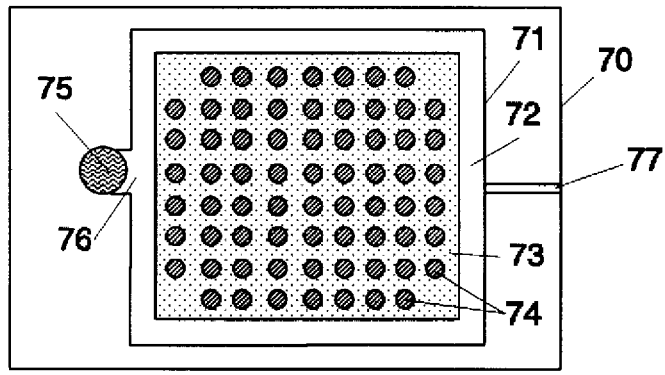
FIG. 8 shows a view of the mold of the invention from the underside, with a chip in place.

FIG. 8 shows a bottom view of a chip (73) with its array of solder connections (74) in place in the cavity (71) in a mold (70). The side region (72) of the cavity forms a gap around the chip (73). The inlet (75) enters the mold at the side of the cavity (71), communicating with the side region (72) through a gate (76) area. At the opposite side of the mold (70) from the gate (76), an air vent (77) allows the entrapped air in the mold to escape. As discussed above, the air vent need not be very large—one mil or less would be sufficient.

Figure 9:
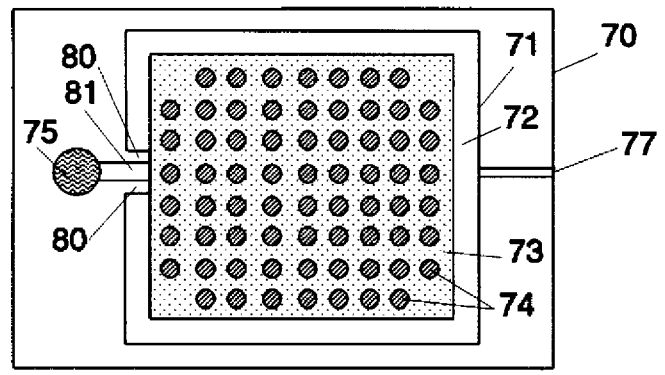
FIG. 9 shows a similar view to FIG. 8, with an adaptation having dams to facilitate underfill of the chip.

In some cases, special gate system has to be designed to prevent the formation of voids under the chip, such as shown in FIG. 9. For example, for a chip which has lots of solder connections in the central region of the chip, the flow in the outer region of the cavity between the chip and the board will precede the flow in the central region because of the bigger flow resistance in the central region. This may lead to the formation of voids underneath the chip.

FIG. 9 shows an arrangement of the gate which is intended to minimize the possibility of voids under the chip.

In this embodiment, dams (80) are placed in the side region (72) surrounding the entrance region (81). These dams (80) prevent the flow of the encapsulant into the side region (72) right after passing the gate region (81). In this case, the encapsulant will pass through the central region under the chip before spreading to the outer region. This will prevent the formation of voids.

Figure 10:
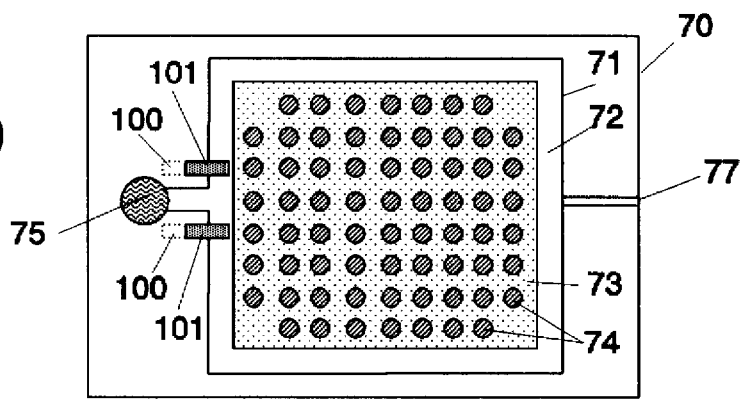
FIG. 10 shows a similar view to FIG. 8, with an adaptation having movable dams to facilitate underfill of the chip.

FIG. 10 shows a similar arrangement to FIG. 9, except that the dams (101) retract into slots (100) when the mold is not in use. The dam can be extended beneath the chip between the solder connections, if desired, to further guide the encapsulant under the chip. This allows the mold (70) to be lowered over the chip (73), and then the dams (101) are extended to create the passageway to direct the flow of encapsulant under the chip. Then, the dams (101) are retracted into their slots (100) as the encapsulant fills the mold, so as not to leave voids in the fillet around the chip. A mechanism may be provided to accomplish this retraction, or the pressure of the encapsulant filling the mold can be used to automatically force the dams back against a spring or other resilient means in the slot.

Figure 11:
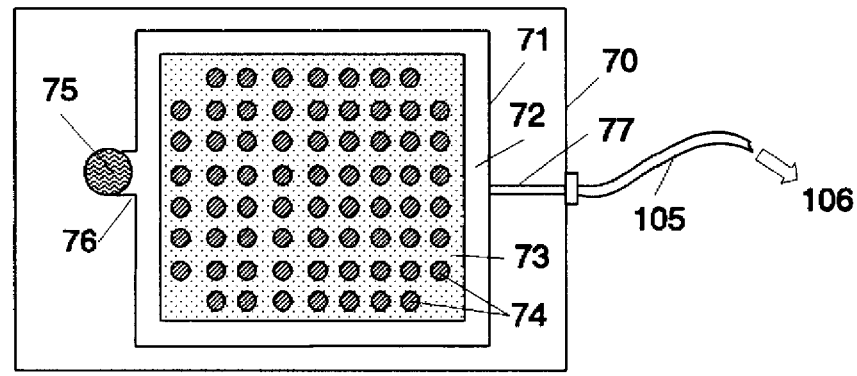
FIG. 11 shows a similar view to FIG. 8, with the addition of vacuum to facilitate underfill.

If desired, as shown in FIG. 11, a vacuum (106) can be applied to the air vent (77) of the mold (70) through a tube (105). This allows the mold (70) to be evacuated prior to introduction of the encapsulant. Without air in the mold, the problem of voids caused by air entrapment is eliminated.

Figure 12:
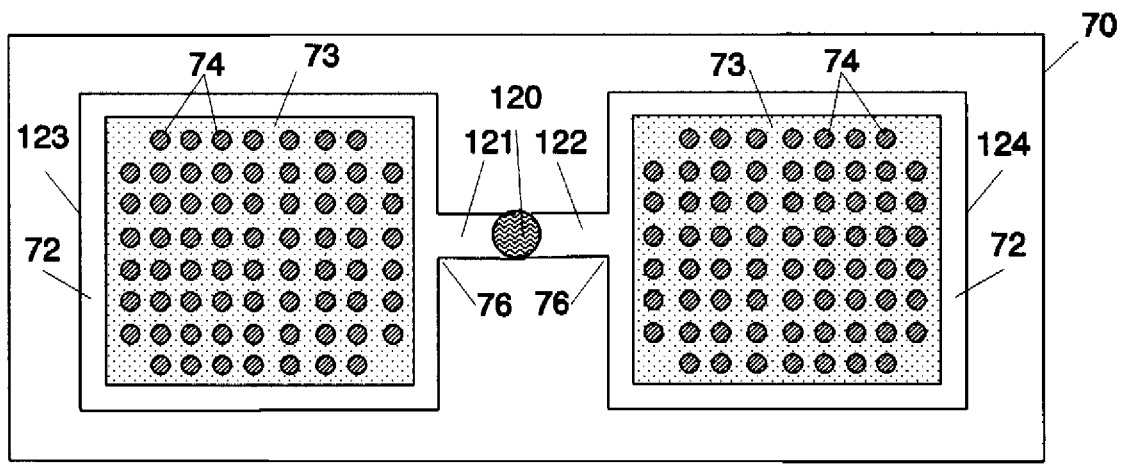
FIG. 12 shows an underside view of an alternate mold for use with multiple chips, having a single injection system.
Figure 13:
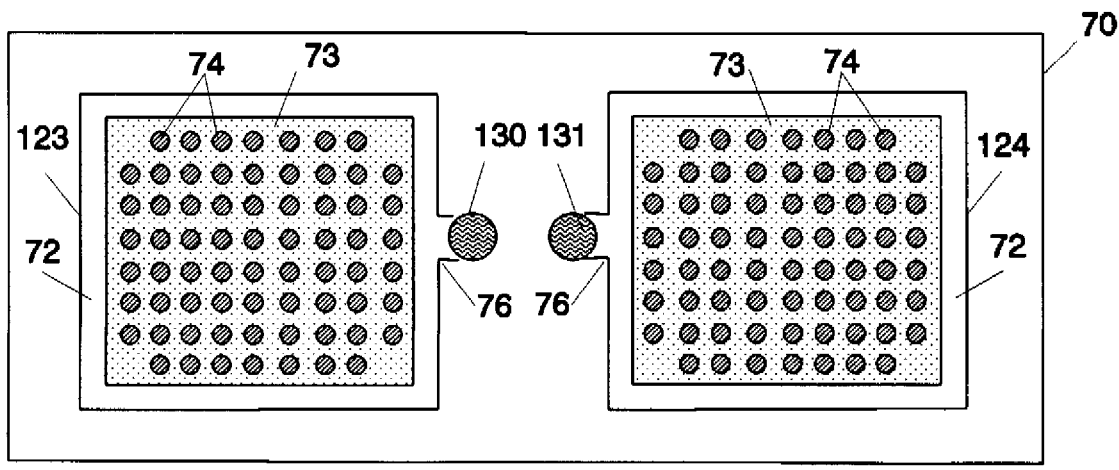
FIG. 13 shows an underside view of an alternate mold for use with multiple chips, having a multiple injection systems.

Faster underfilling of multiple chips on a single substrate can be facilitated through the design of a mold head having multiple cavities for multiple chips. FIGS. 12 and 13 show two embodiments of such a multiple-chip encapsulating mold.

In FIG. 12, the mold shown in the earlier figures is simply doubled, with two mold cavities (123) and (124) spaced as needed to encompass the two chips (73). As in the single chip embodiment, a single injector injects encapsulant into a single inlet (120), which communicates with the two cavities through runners (121) and (122).

Alternatively, as shown in FIG. 13, two injectors can be used, ganged to inject simultaneously through inlets (130) and (131). This can be extended to cases with more than two chips, using the same principles within the teachings of the invention.

Control of Encapsulant Shape by Mold Design

Control of the shape of the fillet around the chip and substrate can be very important in ensuring reliability of the chip. In the past, with underfill accomplished by capillary action of encapsulant applied around the chip with a dispenser, the shape of the fillet was not controllable. The present invention, due to the use of the mold, allows much better control of this fillet shape.

Figure 2:
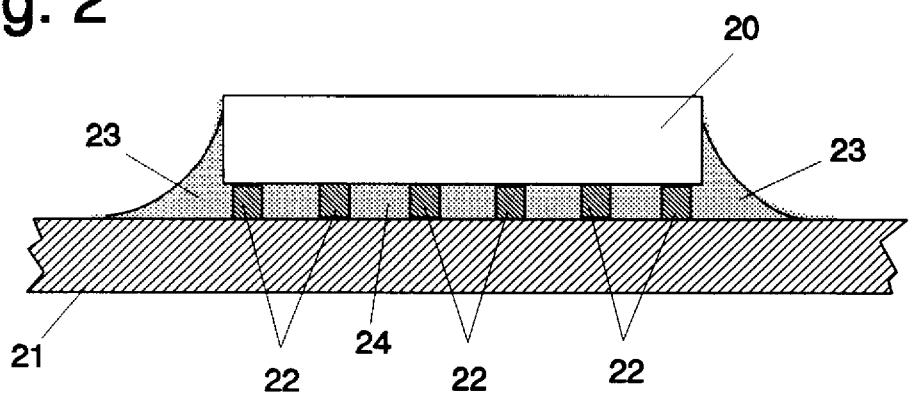
FIG. 2 shows a side cut-away view of a chip after encapsulation without in-mold curing.

FIG. 2 shows how, when the encapsulant is not cured in the mold, the encapsulant which is on the side of the chip (20) may flow after the lifting of the mold-head to form a fillet (23) around the chip (20). Although the shape of this fillet (23) is determined both by mold shape and by the characteristics of the encapsulant as it flows when the mold is lifted, the invention allows the fillet to be kept far more uniform than is possible in dispensing/capillary underfill techniques.

Figure 14:
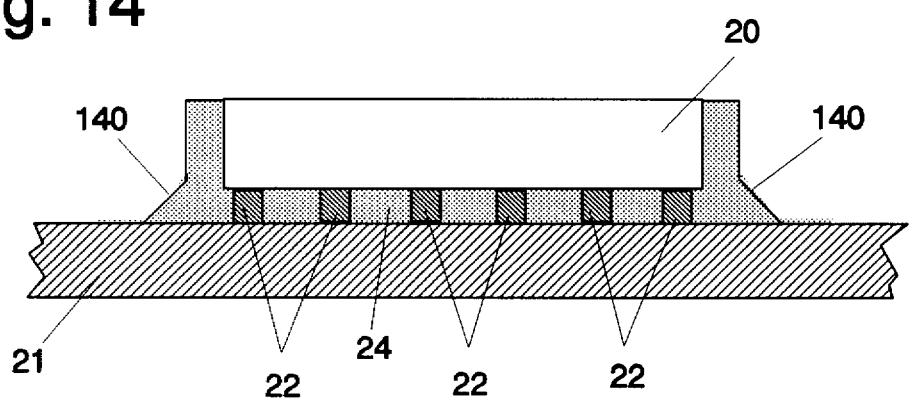
FIG. 14 shows a similar view to FIG. 2, showing the control of fillet shape using in-mold curing.
Figure 7:
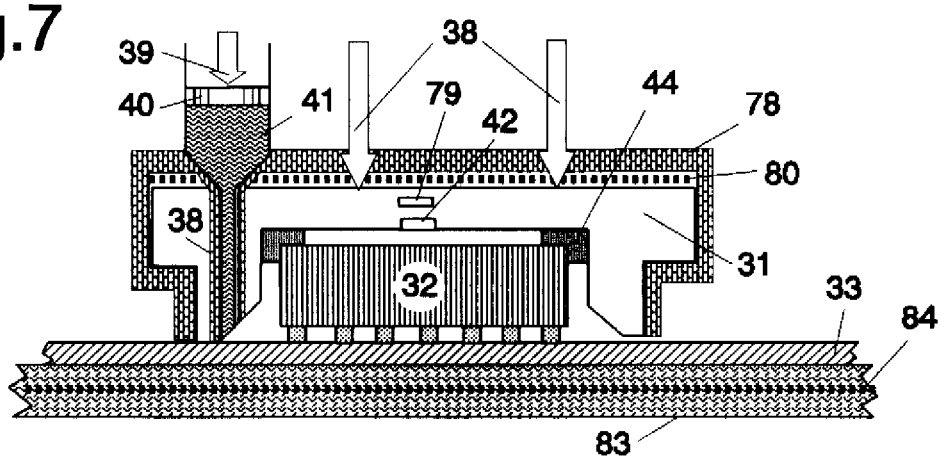
FIG. 7 shows a side cut-away view of another embodiment of the mold of the invention, having heating means for in-mold curing of the encapsulant.

If exact control of the fillet is desired, the encapsulant should be cured in the mold. FIG. 14 shows the result of the use of a mold such as shown in FIG. 7 to cure the encapsulant in the mold. As can be seen, the fillet (140) is shaped exactly as designed into the mold, without the slumping which results when the mold is lifted before curing.

In-mold curing can be facilitated by the addition of mold heating to the apparatus. FIG. 7 shows how the mold of FIG. 4 can be adapted for in-mold curing. The mold body (31) is surrounded by thermal insulation (78) to help retain the heat in the mold. If desired, as shown in FIG. 7, the insulation may also surround the inlet channel (45) from the reservoir of encapsulant, in order to prevent the curing of the encapsulant in the inlet channel. A resistive heater (80) is preferably used to heat the mold, although other methods of mold heating such as circulation of heated fluid are possible within the teachings of the invention. If desired, a thermocouple (79) or other temperature sensor can be provided in the body of the mold (31) to provide for exact regulation of mold temperature. In combination with mold heating, a back-plate (83) under the substrate (33) could also be heated through the inclusion of a similar resistive heating layer (84) or the like.

An automatic scrap ejection system can also be used to clean the scrap after each encapsulation, as is used in the prior art molding machines.

Method of Operation

The operation of the apparatus may be summarized as follows:

1. The mold-head is moved to the location where the chip encapsulation will take place via an X-Y translation system. A vision system, using a sensor in the mold, is preferably used to assure precision X-Y alignment of the chip within the cavity.

2. The mold head is then lowered over the chip, enclosing the chip within the cavity within the mold head.

3. After the mold-head is placed over the chip, a clamping force will be applied to the mold head. An adequate clamping force has to be applied, so as to seal the chip properly while not damaging it.

4. The encapsulant will then be transferred into the mold cavity through an inlet, by the movement of piston in the injection system. The encapsulant infiltrates under the chip and fills the side region around the chip, expelling the air in the mold cavity through an air vent in the mold, preferably at a point opposite the inlet. The encapsulant is injected under pressure, which will be determined based on the characteristics of the encapsulant chosen, the chip design, mold design, desired fill time, and other factors. The upper limit on the pressure applied is set by the need to avoid damage to the chip or substrate during injection, the need to counteract the force with a downward force on the mold and practical problems dealing with extremely high pressures. Pressures of up to 1,000 psi are practical with the apparatus of the invention.

5. After the filling of the cavity is complete, if in-mold heating is desired to cure the encapsulant, heat is applied to the mold. In this case, the mold is left in place until the encapsulant is cured.

6. The mold is lifted.

7. Scrap is cleaned and the system is ready for the next cycle.

Feasibility Test Results

An apparatus constructed according to the teachings of the invention was used to encapsulate a typical flip chip which has a dimension of 0.3 inch square. Hysol® FP 4510 thermosetting polymer encapsulant, manufactured by The Dexter Corporation, 2 Elm Street, Windsor Locks Conn., was used.

The process was done at room temperature with injection pressure of 40 psi. The filling time was about 3 seconds. Further experiments have shown that this time could be reduced, if a higher pressure injection or higher temperature is used. After completion of the filling, the encapsulant was cured at 150° C. for about 2 hours.

After encapsulation, the chip was gradually ground off and the encapsulated layer was inspected visually. The encapsulant was found to have completely underfilled the chip without voids or gaps.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

References

Alves, F. D., Banerji, K. and Darveaux, R. F., 1993, "Vacuum Infiltration of Underfill Material for Flip-Chip Devices", U.S. Pat. No. 5,203,076.

Dion, J., Borgesen, P., Yost, B., Lilienfeld, D. A. and Li, C. Y., 1994, "Material and Reliability Considerations for Anisotropically Conductive Adhesive Based Interconnects", Mat. Res. Soc. Symp., Proc. 323, Pittsburgh, Pa.

Giesler, J., O'Malley, G., Williams, M. and Machuga, S., 1994, "Flip Chip on Board Connection Technology: Process Characterization and Reliability", IEEE CPMT, pt. B, v. 1 7, 256–263.

Hall, G. L., 1995, "Liquid Crystal Polymer Encapsulated Electronic Devices and Methods of Making the Same", U.S. Pat. No. 5,381,599.

Machuga, S. C., Lindsey, S. E., Moore, K. D. and Skipor, A. F., 1992, "Encapsulation of Flip Chip Structures", IEEE/ CHMT Symposium, p.53.

Miller, L. F., 1969, "Controlled Collapse Reflow Chip Joining", IBM J of Res. and Dev., v. 1 3, 239–250.

Nakano, F., Soga, T., Amagi, S., 1987, "Resin Insertion Effect on Thermal Cycle Resistivity of Flip-Chip Mounted LSI Devices", ISHM Conf., 536–541.

O'Malley, G., Giesler, J. and Machuga, 1994, "The Importance of Material Selection for Flip Chip on Board Assemblies", IEEE CPMT, Pt. B, v.1 7, 248.

Suryanarayana, D., Hsiao, R., Gall, T. P., McCreary, J. M., 1991, "Enhancement of Flip Chip Fatigue Life by Encapsulation", IEEE CHMP, v.14, 218–223.

Suryanarayana, D., Wu, T. Y., Varcoe, J. A., 1993, "Encapsulants Used in Flip-Chip Package", 43rd ECTC, Orlando, Fla.

Thompson, K. R., Banerji, K. and Alves, F. D., 1993, "Semiconductor Device with Controlled Spread Polymeric Underfill", U.S. Pat. No. 5,218,234.

Tummala, R. R., Rymaszewski, E. J., 1989, Microelectronics Packaging Handbook, Van Nostrand Reinhold, N.Y.

What is claimed is:

1. A method of underfill encapsulation of an integrated circuit chip against a substrate, using a mold head for enclosing the chip and encapsulant, comprising the steps of:

a) locating the mold head over the chip;

b) lowering the mold head into contact with the substrate, the chip fitting within a cavity within the mold head, and the mold head sealing around the periphery of the chip creating a side region for formation of a fillet around the chip, the mold head contacting the upper surface of the chip and holding it in position against the substrate;

c) applying a clamping force to the mold head;

d) injecting the encapsulant under pressure through an inlet into the cavity, and allowing entrapped air to escape through an air vent in the mold head; and e) lifting of the mold after the completion of encapsulant flow.

2. The method of claim 1, further comprising the step, after step (c) thereof, of applying a vacuum to evacuate the air from the cavity.

3. The method of claim 1, further comprising the step, after step (d) thereof, of curing of the encapsulant in the mold by applying heat to the mold.

4. A method of underfill encapsulation of an integrated circuit chip against a continuous substrate, using a mold head for enclosing the chip and encapsulant, comprising the steps of:

a) locating the mold head over the chip;

b) lowering the mold head into contact with the substrate, said substrate being continuous under said mold head, the chip fitting within a cavity within the mold head, and the mold head sealing around the periphery of the chip creating a side region for formation of a fillet around the chip, the mold head contacting the upper surface of the chip and holding it in position against the substrate;

c) applying a clamping force to the mold head;

d) injecting the encapsulant under pressure through an inlet into the cavity, and allowing entrapped air to escape through an air vent in the mold head; and e) lifting of the mold after the completion of encapsulant flow.

5. The method of claim 4, wherein said pressure ranges from approximately 15 psi to 1,000 psi.

6. The method of claim 4, further comprising the step, before step (d), of placing at least one dam in said side region.

* * * * *